(12) United States Patent
Tousain et al.

(10) Patent No.: US 8,355,115 B2
(45) Date of Patent: Jan. 15, 2013

(54) POSITIONING SYSTEM, METHOD, AND LITHOGRAPHIC APPARATUS

(75) Inventors: Robertus Leonardus Tousain, Eindhoven (NL); Martijn Robert Hamers, 's-Hertogenbosch (NL); Jeroen Arnoldus Leonardus Johannes Raaymakers, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 594 days.

(21) Appl. No.: 12/576,079

(22) Filed: Oct. 8, 2009

(65) Prior Publication Data

US 2010/0091262 A1    Apr. 15, 2010

Related U.S. Application Data

(60) Provisional application No. 61/104,144, filed on Oct. 9, 2008.

(51) Int. Cl.
*G03B 27/58* (2006.01)

(52) U.S. Cl. ............. 355/72; 355/30; 355/53; 310/46; 310/98; 310/109; 318/671; 318/798; 318/822; 318/249; 318/491

(58) Field of Classification Search .............. 355/30, 355/53, 72; 310/46, 98, 109; 318/671, 798, 318/822, 249, 491, 543, 544
See application file for complete search history.

(56) References Cited

U.S. PATENT DOCUMENTS 7,275,627 B1 * 10/2007 Mayama ............... 188/378
2007/0035713 A1 * 2/2007 Shibayama ............. 355/72

* cited by examiner

*Primary Examiner* — Peter B Kim
*Assistant Examiner* — Mesfin T Asfaw
(74) *Attorney, Agent, or Firm* — Pillsbury Winthrop Shaw Pittman LLP

(57) ABSTRACT

A lithographic apparatus includes a positioner configured to position a first part of the apparatus relative to a second part of the apparatus, the positioner including a motor having a motor position dependent motor constant defining a relation between a motor input and a motor output, and a control system to drive the motor, the control system including a set-point generator to provide a reference signal based on a desired position of the first part relative to the second part, and a controller to provide a drive signal to the motor based on the reference signal, wherein the controller includes a compensator which is configured to at least partially compensate the drive signal for the motor position dependent motor constant. The invention further relates to a positioner, a method to optimize the positioning system, and a method to derive a motor position dependent motor constant.

16 Claims, 5 Drawing Sheets

POSITIONING SYSTEM, METHOD, AND LITHOGRAPHIC APPARATUS

CROSS REFERENCE TO RELATED APPLICATIONS

This application claims priority and benefit under 35 U.S.C. §119(e) to U.S. Provisional Patent Application No. 61/104,144, entitled "A Positioning System, Method, and Lithographic Apparatus", filed on Oct. 9, 2008. The content of that application is incorporated herein in its entirety by reference.

FIELD

The present invention relates to a positioning system including a motor having a position dependent motor constant and a control system to drive the motor. The present invention also relates to a lithographic apparatus including such a positioning system. Further, the present invention relates to a method to optimize the positioning system and a method to derive the motor position dependent motor constant of a motor.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Commonly, and especially in scanners, the substrate and the patterning device are supported by a corresponding support structure, wherein the support structure is movable with respect to a frame. The frame may be a base frame or a metrology frame. The support structure is positioned with respect to the frame by a positioning system including a motor and a control system to drive the motor. Motors in general can be characterized by a parameter known as "motor constant". The motor constant defines a relation between motor input and motor output. Examples of a motor input are current, voltage, frequency, etc. Examples of a motor output are velocity, acceleration, force, torque, etc. Most of the time, the motor constant is assumed to be a constant parameter, explaining the name motor constant. However, in practice, motors exhibit a motor position dependent motor constant which can be divided into a constant average portion and a motor position dependent portion. Thus, when a person skilled in the art assumes a constant motor constant, he/she actually assumes the motor constant to be the constant average portion. The motor constant is motor position dependent due to for instance structural inaccuracies, tolerances, and/or deficiencies or inhomogeneous properties, such as material properties. Possible causes for the motor position dependency of the motor constant of an electromagnetic motor are:

1. variations in gap between magnets;
2. variations in size of the magnets;
3. variations in magnetic field strength and magnetization direction/orientation of the magnets;
4. non-ideal winding of coils;
5. different winding of different coils;
6. non-ideal commutation; and
7. local temperature effects.

As used hereinafter, the motor position is a relative position of different motor parts with respect to each other, e.g. a rotor with respect to a stator. If the motor is a rotational motor, the motor position after a 360° rotation is the same. It is possible that there is a one on one relation with a position of an object positioned by the motor. But especially after a rotation of 360° of a rotational motor, the object may be in a different position, while the motor position is the same. In an electromagnetic planar motor, the motor position is a position of one or more coils (also called actuator) with respect to an array of permanent magnets or the position of (an array of) magnets with respect to the coil(s). Note that the motor position is not limited to a one degree of freedom case, but can also be a multi degree of freedom position. With a degree of freedom is meant a translation (X, Y, or Z) or a rotation (Rx, Ry, or Rz)

The motor position dependent portion of the motor constant introduces disturbances in the positioning system which negatively influence the position accuracy of the positioning system. In many applications, the assumption of the motor constant being a constant parameter suffices, since the disturbances introduced, or the effect of the introduced disturbances, by the motor position dependent portion of the motor constant are most of the time small compared to a desired position accuracy of the positioning system. The motor position dependent portion can therefore be neglected. Also, the disturbances are only present while moving the motor from one motor position to another motor position and do not affect the position accuracy of the positioning system when the motor is stationary, i.e. the different motor parts do not move with respect to each other.

In a lithographic apparatus, and especially in so-called scanners, the position accuracy during movement of the motor is becoming more and more important. In a scanner, each target portion is irradiated by scanning the pattern through the radiation beam in a given direction while synchronously scanning the substrate parallel or anti-parallel to this direction. Scanning of the substrate and/or pattern is done by moving the corresponding support structure with respect to the frame using a positioning system. With an increasing required positioning accuracy of the positioning system during scanning, the motor position dependent portion of the motor constant becomes a non-negligible disturbance factor. The motor position dependent portion of the motor constant not only affects the position accuracy of each positioning system, but also affects the mutual position accuracy between the substrate and pattern while scanning. A disturbance in the mutual position may result in overlay errors and/or imaging problems of the lithographic apparatus.

SUMMARY

It is desirable to provide a positioning system (broadly termed a positioner) with an increased position accuracy. It is further desirable to provide a lithographic apparatus with reduced overlay errors and/or imaging problems.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and a positioner configured to position a first part of the apparatus relative to a second part of the apparatus, including a motor having a motor position dependent motor constant defining a relation between a motor input and a motor output, and a control system to drive the motor, the control system including a set-point generator to provide a reference signal based on a desired position of the first part relative to the second part, and a controller to provide a drive signal to the motor based on the reference signal, wherein the controller includes a compensator which is configured to at least partially compensate the drive signal for the motor position dependent motor constant.

According to another embodiment of the invention, there is provided a positioner configured to position a first object relative to a second object, including:
a motor having a motor position dependent motor constant defining a relation between a motor input and a motor output, and a control system to drive the motor, the control system including a set-point generator to provide a reference signal based on a desired position of the first object relative to the second object, and a controller to provide a drive signal to the motor based on the reference signal, wherein the controller includes a compensator which is configured to at least partially compensate the drive signal for the motor position dependent motor constant.

According to a further embodiment of the invention, there is provided a method to optimize a positioner, the positioner configured to position a first object relative to a second object and including a motor having a motor position dependent motor constant defining a relation between a motor input and a motor output, and a control system to drive the motor, the control system including a set-point generator to provide a reference signal based on a desired position of the first object relative to the second object, and a controller to provide a drive signal to the motor based on the reference signal, wherein the controller includes a compensator which is configured to at least partially compensate the drive signal for the motor position dependent motor constant with a motor position dependent compensation value, the method including: a) providing a reference signal and a motor position dependent compensation value to the positioner and measuring a corresponding error signal, the error signal being the difference between the reference signal and signals provided by a sensor; b) deriving a model of the positioner to predict the effect of changes in the motor position dependent compensation value on the error signal; c) predicting a change of the motor position dependent compensation value which reduces the error signal using the model, the reference signal, the position dependent compensation value, and the error signal.

According to another embodiment of the invention, there is provided a method to derive a motor position dependent compensation value of a positioner, the positioner configured to position a first object relative to a second object, including a motor having a motor position dependent motor constant defining a relation between a motor input and a motor output, and a control system to drive the motor, the control system including a set-point generator to provide a reference signal based on a desired position of the first object relative to the second object, and a controller to provide a drive signal to the motor based on the reference signal, wherein the controller includes a compensator which is configured to at least partially compensate the drive signal for the motor position dependent motor constant with the motor position dependent compensation value, the method including: a) providing an input signal to the positioner at different motor positions; b) measuring a response of the motor to the input signal by measuring a position quantity of the motor with a sensor at the different motor positions; c) determine a relation between the input signal and corresponding response at the different motor positions; and d) derive the motor position dependent compensation value from the determined relation between input signal and corresponding response and a preferred relation between input signal and motor response so that the motor position dependent compensation value will result in the preferred relation.

According to yet another embodiment of the invention, there is provided a method to derive a motor position dependent motor constant of a motor including: a) providing an input signal at different motor positions; b) measuring a response of the motor to the input signal by measuring a position quantity of the motor with a sensor at the different motor positions; c) determine a relation between the input signal and corresponding response at the different motor positions; d) dividing the relation into a motor position dependent component and a frequency dependent component; e) deriving from the motor position dependent component the motor position dependent motor constant.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
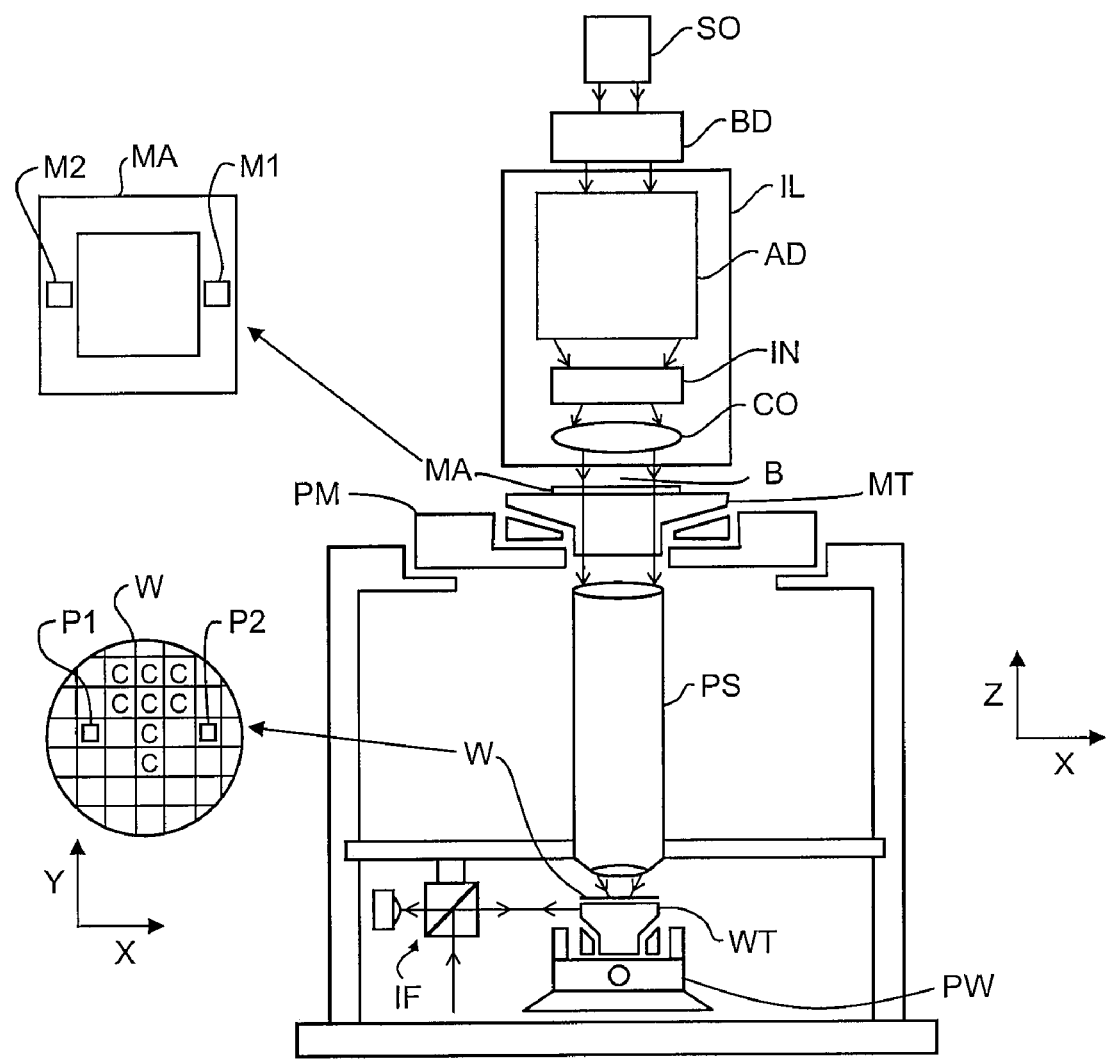
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus further includes one or more positioning systems (not shown) (also broadly termed hereinafter positioner(s)) to position a first part of the apparatus, such as the patterning device support (e.g. mask table) MT and/or the second positioning device PW with respect to a second part of the apparatus, for instance the first positioning device PM and a frame FR respectively. The frame FR may be a base frame or a metrology frame. The positioning system or positioner includes a motor, for instance a long-stroke actuator for coarse positioning or a short-stroke motor for fine positioning, and a control system to drive the motor. In scan mode, the long-stroke motor is commonly used to move the substrate or patterning device relative to the frame. In an embodiment of the invention, the control system includes a set-point generator to provide a reference signal based on a desired position of the first part relative to the second part, and a controller to provide a drive signal to the motor based on the reference signal, the controller including a compensator which is configured to at least partially compensate the drive signal for a motor position dependent motor constant of a motor. By compensating for the motor position dependent motor constant, the disturbances introduced by the motor position dependent motor constant are reduced, thereby increasing the position accuracy of the positioner. In scan mode, it will also increase the position accuracy between the substrate and the patterning device, thereby reducing overlay errors and/or imaging deficiencies of the lithographic apparatus.

Figure 2A:
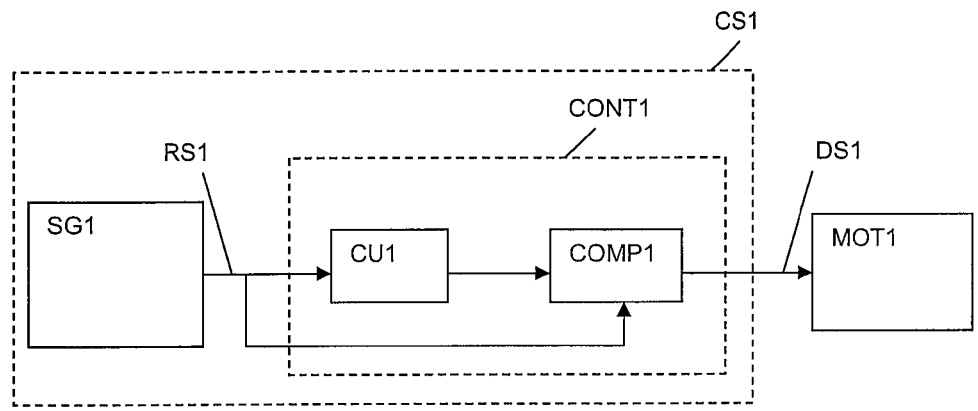
FIG. 2A depicts a block diagram of a positioner according to another embodiment of the invention.

FIG. 2A depicts a block diagram of a positioner according to an embodiment of the invention, including a motor MOT1 and a control system CS1 to provide a drive signal DS1 to the motor MOT1. The positioner is configured to position a first object relative to a second object (not shown). The motor MOT1 can be any type of motor, but is preferably an electromagnetic motor, such as an iron core motor, reluctance motor, or Lorentz motor, and can be a rotational motor or a linear/planar motor. The drive signal DS1 can be a motor input, such as a current, but can also be another type of signal, such as a force signal, which the motor MOT1 converts into a corresponding motor input by way of a convertor (not shown). The convertor may include a commutation scheme to calculate the motor input from the drive signal DS1, and power supplies.

The motor MOT1 has a motor position dependent motor constant defining a relation between motor input and motor output. For an electromagnetic motor, the motor constant is usually the relation between input current and output force.

The control system CS1 may be formed by any type of control system and may be implemented in software to be executed by a microprocessor, microcontroller, or any other programmable device, or may be implemented by dedicated hardware. In this embodiment, the control system CS1 includes a set-point generator SG1 to provide a reference signal RS1 based on a desired position quantity of the first object relative to the second object, such as mutual position, velocity, acceleration, jerk, etc. If the position quantity of the first object relative to the second object can be matched to a position quantity of the motor MOT1 (for instance in case of a planar/linear motor), the set-point generator SG1 may provide a reference signal RS1 based on a desired position quantity of the motor. The control system CS1 further includes a controller CONT1 to provide the drive signal DS1 to the motor MOT1 based on the reference signal RS1.

A control unit CU1 of the controller CONT1 provides an initial drive signal to the motor MOT1. The initial drive signal can be modified by a compensator COMP1 of the controller CONT1, the compensator COMP1 being configured to at least partially compensate the initial drive signal for the motor position dependent motor constant. The modification of the initial drive signal by the compensator COMP1 is in this case based on the reference signal. The compensator COMP1 can determine based on the reference signal what the motor position of the motor MOT1 should be, and based on this information can modify the initial drive signal. In this embodiment, the compensator COMP1 outputs the drive signal DS1. Modification of the initial drive signal may be done by multiplying the initial drive signal with a motor position dependent compensation value.

By compensating for the motor position dependent motor constant, the disturbances introduced by the motor position dependent motor constant are reduced, thereby increasing the position accuracy of the positioner.

Figure 2B:
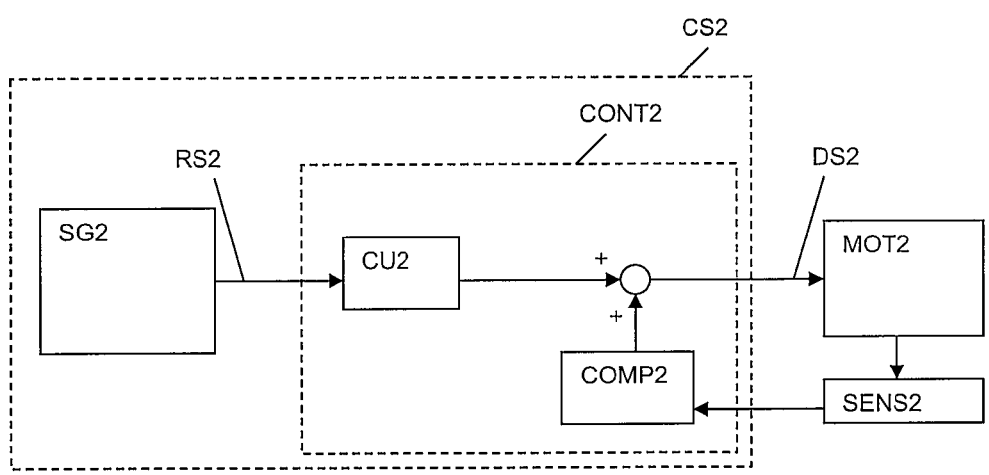
FIG. 2B depicts a block diagram of a positioner according to yet another embodiment of the invention.

FIG. 2B depicts a block diagram of a positioner according to another embodiment of the invention, including a motor MOT2 and a control system CS2 to provide a drive signal DS2 to the motor MOT2. The positioner is configured to position a first object relative to a second object (not shown). The motor MOT2 can be any type of motor, but is preferably an electromagnetic motor, such as an iron core motor, reluctance motor, or Lorentz motor and can be a rotational motor or a linear/planar motor. The drive signal DS2 can be a motor input, such as a current, but can also be another type of signal, such as a force signal, which the motor MOT2 converts into a corresponding motor input by way of a convertor (not shown). The convertor may include a commutation scheme to derive the motor input from the drive signal DS2, and power supplies.

The motor MOT2 has a motor position dependent motor constant defining a relation between motor input and motor output. For an electromagnetic motor, the motor constant is usually the relation between input current and output force.

The control system CS2 may be formed by any type of control system and may be implemented in software to be executed by a microprocessor, microcontroller, or any other programmable device, or may be implemented by dedicated hardware. In this embodiment, the control system CS2 includes a set-point generator SG2 to provide a reference signal RS2 based on a desired position quantity of the first object relative to the second object, such as mutual position, velocity, acceleration, jerk, etc. If the position quantity of the first object relative to the second object can be matched to the position quantity of the motor MOT2 (for instance in the case of a planar/linear motor), the set-point generator SG2 may provide a reference signal RS2 based on a desired position quantity of the motor. The control system CS2 further includes a controller CONT2 to provide the drive signal DS2 to the motor MOT2 based on the reference signal RS2.

A control unit CU2 of the controller CONT2 provides an initial drive signal to the motor MOT2. The initial drive signal can be modified by a compensator COMP2 of the controller CONT2, the compensator COMP2 being configured to at least partially compensate the initial drive signal for the motor position dependent motor constant. The modification of the initial drive signal by the compensator COMP2 is in this case based on a position quantity of the motor MOT2 measured by a sensor SENS2. The sensor SENS2 may be part of the positioner, for instance integrated in the motor MOT2, but can also be an external sensor. It is also possible that the sensor SENS2 measures a position quantity of the first object relative to the second object, in that case the compensator COMP2 first derives the position quantity of the motor MOT2 from the signals provided by the sensor SENS2. In this embodiment, the drive signal DS2 is the combination of the output of the control unit CU2 and the output of the compensator COMP2. Both outputs are added to each other and result in a drive signal DS2.

By compensating for the motor position dependent motor constant, the disturbances introduced by the motor position dependent motor constant are reduced, thereby increasing the position accuracy of the positioner.

Figure 3A:
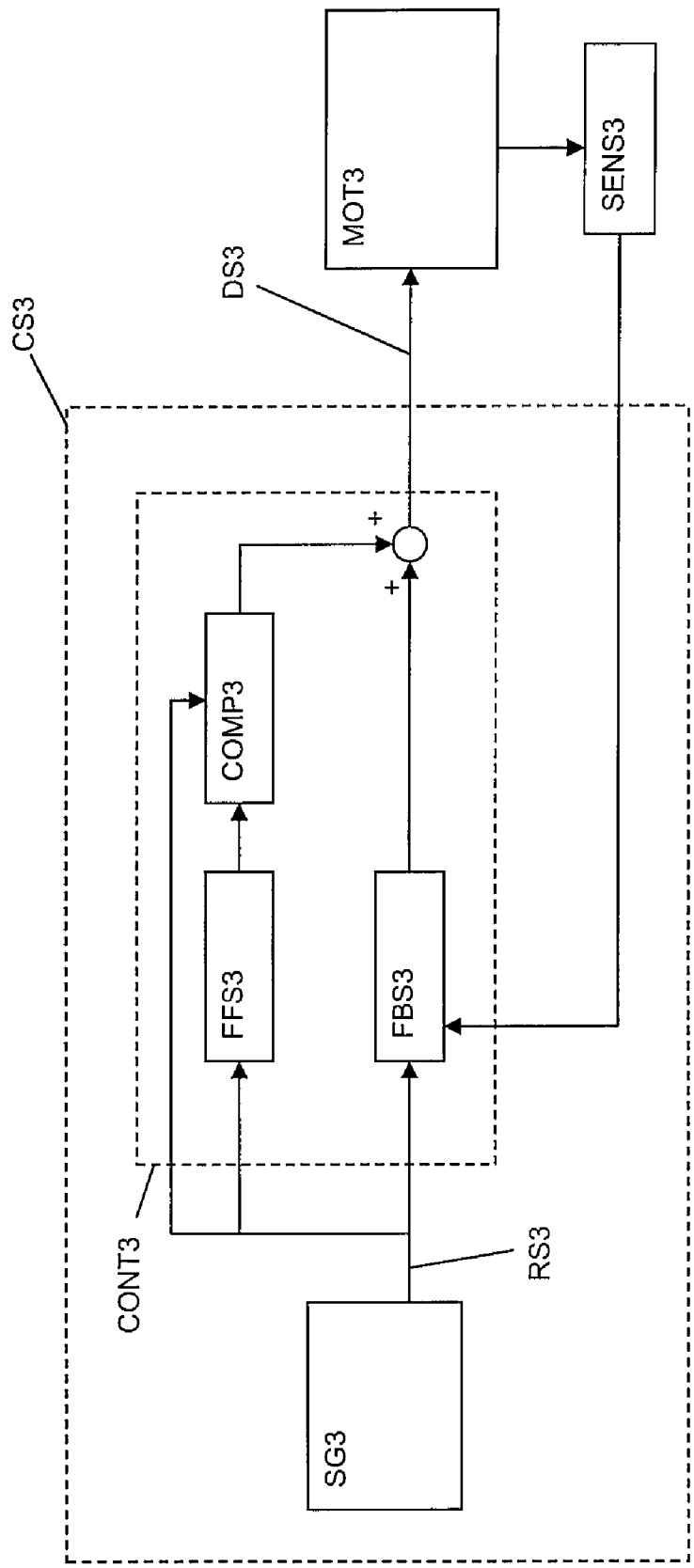
FIG. 3A depicts a block diagram of a positioner according to a further embodiment of the invention.

FIG. 3A depicts a block diagram of a positioner according to yet another embodiment of the invention, including a motor MOT3 and a control system CS3 to drive the motor MOT3. The positioner is configured to position a first object relative to a second object (not shown). The motor MOT3 can be any type of motor, but is preferably an electromagnetic motor, such as an iron core motor, reluctance motor, or Lorentz motor and can be a rotational motor or a linear/planar motor. The drive signal DS3 can be a motor input, such as a current, but can also be another type of signal, such as a force signal, which the motor MOT3 converts into a corresponding motor input by way of a convertor (not shown). The convertor may include a commutation scheme to derive the motor input from the drive signal DS3, and power supplies.

The motor MOT3 has a motor position dependent motor constant defining a relation between motor input and motor output. For an electromagnetic motor, the motor constant is usually the relation between input current and output force.

The control system CS3 may be formed by any type of control system and may be implemented in software to be executed by a microprocessor, microcontroller, or any other programmable device, or may be implemented by dedicated hardware. The control system CS3 includes a set-point generator SG3 to provide a reference signal RS3 based on a desired position quantity of the first object relative to the second object, such as mutual position, velocity, acceleration, jerk, etc. If the position quantity of the first object relative to the second object can be matched to the position quantity of the motor MOT3 (for instance in the case of a planar/linear motor), the set-point generator SG3 may provide a reference signal RS3 based on a desired position quantity of the motor.

The control system further includes a controller CONT3 to provide a drive signal DS3 to the motor MOT3 in dependency of the reference signal RS3. The controller CONT3 has a feed forward system FFS3 and a feedback system FBS3, wherein the feed forward system FFS3 provides an initial drive signal in dependency of the reference signal RS3. The feedback system FBS3 provides an initial drive signal in dependency of the difference between the reference signal RS3 and the signals provided by a sensor SENS3 which is configured to measure a position quantity of the motor MOT3. It is also possible that the sensor SENS3 measures a position quantity of the first object relative to the second object. The initial drive signal from the feed forward system FFS3 is modified by a compensator COMP3 to compensate for the motor position dependent motor constant of the motor MOT3. The output of the compensator COMP3 is combined with the initial drive signal from the feedback system FBS3 to provide the drive signal DS3. As is known in the art, a feed forward system provides a drive signal based on a desired position quantity, and a feedback system provides a drive signal based on an error being the difference between the desired position quantity and an actual position quantity. In other words, the feed forward system FFS3 aims to drive the motor MOT3, and the feedback system FBS3 aims to reduce the error by adjusting the initial drive signal provided by the feed forward system FFS3.

The modification of the initial drive signal of the feed forward system FFS3 by the compensator COMP3 is in this case based on the reference signal RS3. The compensator COMP3 can determine based on the reference signal RS3 what the motor position of the motor MOT3 should be, and based on this information modifies the initial drive signal of the feed forward system FFS3. Modification of the initial drive signal may be done by multiplying the initial drive signal of the feed forward system FFS3 with a motor position dependent compensation value or by adding such a value.

By compensating for the motor position dependent motor constant, the disturbances introduced by the motor position dependent motor constant are reduced, thereby increasing the position accuracy of the positioner. By providing the compensator in series with the feed forward system FFS3 only, has the benefit that the dependency of the error on the motor position dependent compensation value can be linear. This is beneficial to optimize the motor position dependent compensation value, as will be explained later.

Figure 3B:
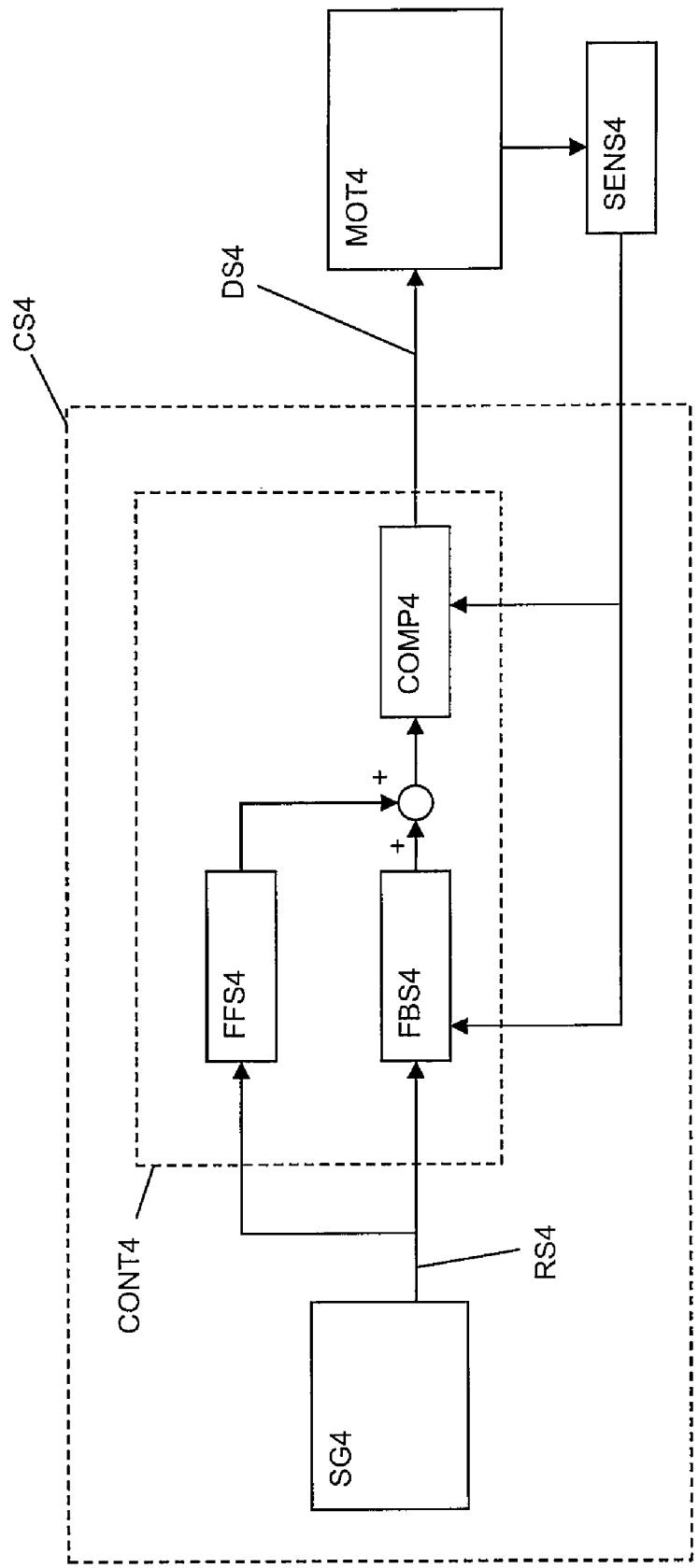
FIG. 3B depicts a block diagram of a positioner according to yet another embodiment of the invention.

FIG. 3B depicts a block diagram of a positioner according to yet another embodiment of the invention, including a motor MOT4 and a control system CS4 to drive the motor MOT4. The positioner is configured to position a first object relative to a second object. The motor MOT4 can be any type of motor, but is preferably an electromagnetic motor, such as an iron core motor, reluctance motor, or Lorentz motor and can be a rotational motor or a linear/planar motor. The drive signal DS4 can be a motor input, such as a current, but can also be another type of signal, such as a force signal, which the motor MOT4 converts into a corresponding motor input by way of a convertor (not shown). The convertor may include a commutation scheme to derive the motor input from the drive signal DS2, and power supplies.

The motor MOT4 has a motor position dependent motor constant defining a relation between motor input and motor output. For an electromagnetic motor, the motor constant is usually the relation between input current and output force.

The control system CS4 may be formed by any type of control system and may be implemented in software to be executed by a microprocessor, microcontroller, or any other programmable device, or may be implemented by dedicated hardware. The control system CS4 includes a set-point generator SG4 to provide a reference signal RS4 based on a desired position quantity of the of the first object relative to the second object, such as mutual position, velocity, acceleration, jerk, etc. If the position quantity of the first object (not shown) relative to the second object can be matched to the position quantity of the motor MOT4 (for instance in the case of a planar/linear motor), the set-point generator SG4 may provide a reference signal RS4 based on a desired position quantity of the object.

The control system further includes a controller CONT4 to provide a drive signal DS4 to the motor MOT4 in dependency of the reference signal RS4. The controller CONT4 has a feed forward system FFS4 and a feedback system FSB4, wherein the feed forward system FFS4 provides an initial drive signal in dependency of the reference signal RS4. The feedback system FBS4 provides an initial drive signal in dependency of the difference between the reference signal RS4 and the signals provided by a sensor SENS4 which is configured to measure a position quantity of the motor MOT4. It is also possible that the sensor SENS4 measures a position quantity of the first object relative to the second object. The initial drive signals from the feed forward system FFS4 and the feedback system FBS4 are combined and modified by a compensator COMP4 to compensate for the motor position dependent motor constant of the motor MOT4. As is known in the art, a feed forward system provides a drive signal based on a desired position quantity, and a feedback system provides a drive signal based on an error being the difference between the desired position quantity and an actual position quantity. In other words, the feed forward system aims to drive the motor MOT4, and the feedback system FBS4 aims to reduce the error by adjusting the drive signal provided by the feed forward system FFS4.

The modification of the initial drive signals of the feed forward system FFS4 and the feedback system FBS4 by the compensator COMP4 is in this case based on the signals provided by the sensor SENS4. The compensator COMP4 can determine based on the signals provided by the sensor SENS4 what the motor position of the motor MOT4 is, and based on this information modifies the initial drive signals of the feed forward system FFS4 and the feedback system FBS4. Modification of the initial drive signal may be done by multiplying the initial drive signals of the feed forward system FFS4 and the feedback system FBS4 with a motor position dependent compensation value or by adding of such a value.

By compensating for the motor position dependent motor constant, the disturbances introduced by the motor position dependent motor constant are reduced, thereby increasing the position accuracy of the positioner.

The motor position dependent compensation value used in embodiments, wherein the motor position dependent compensation value is multiplied with an initial drive signal, such as for instance in the embodiments of FIGS. 2A, 3A, and 3B, can be for instance $1/K(x)$, wherein $K(x)$ is a normalized motor position dependent motor constant, and x represents the motor position. The motor position dependent motor constant has been normalized with the constant average portion of the motor position dependent motor constant, resulting in that $K(x)$ is 1 when the motor position dependent motor constant is equal to the constant average portion of the motor position dependent motor constant.

The motor position dependent compensation value can be available in any type, including continuous functions, discrete functions, algorithms, lookup tables, etc.

Figure 4A:
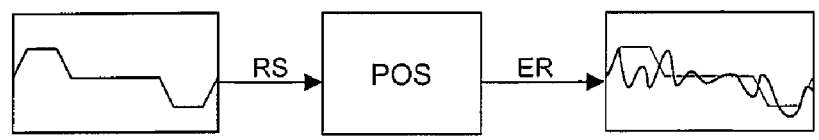
FIG. 4A depicts a highly schematic block diagram of a scan for a method according to an embodiment of the invention.
Figure 4B:
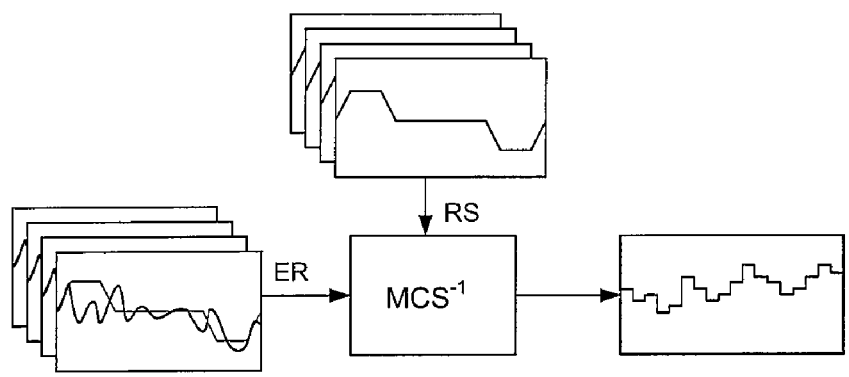
FIG. 4B depicts a highly schematic block diagram of an estimation of a change of a motor position dependent compensation value for a method according to another embodiment of the invention.

FIGS. 4A and 4B depict in a highly schematic way a method to optimize a motor position dependent compensation value of a compensator in a positioner similar to the previous described embodiments. The method is based on the fact that a model MCS of the positioner POS is available. The model can be an open loop model such as in the embodiments of FIGS. 2A and 2B, or a closed loop model as in the embodiments of FIGS. 3A and 3B.

The model MCS of the positioner POS allows to predict the effect of changes in the motor position dependent compensation value on an error, the error being the difference between the reference signal and the signals provided by a sensor. Preferably, the compensator is described in terms of parameters to get a linear relation between the error and the change in the motor position dependent compensation value. In case of the presence of a feed forward system and a feedback system, the compensator is only provided in series with the feed forward system. As described before, this makes it easier to obtain a linear relation. The linear behavior of the relation can be used in an inverse manner to estimate how, given an error signal, the motor dependent compensation value should/can be changed in order to decrease the error.

FIG. 4A shows a block diagram of a scan. In the scan, a reference signal RS is supplied to the positioner POS. The positioner POS may have an "old" motor position dependent compensation value, which is to be updated, but it is also possible that no "old" motor position dependent compensation value is available and/or that an arbitrary motor position dependent compensation value is used. In case of the latter, the arbitrary motor position dependent compensation value is preferably a constant average portion of a motor position dependent motor constant. The constant average portion, or an estimation thereof may be found in the motor specifications.

While the scan is performed, an error ER, being the difference between the reference signal and the signals provided by the sensor, is monitored and recorded or measured. The error ER together with the corresponding reference signal RS can be used to estimate a change of the "old" or arbitrary motor position dependent compensation value in order to reduce the error, as is schematically shown in FIG. 4B. FIG. 4B also shows that several errors and corresponding reference signals of different scans can be used to estimate the motor position dependent compensation value. Multiple scans are performed in case one scan is not covering the entire motor position range and multiple scans are desired to estimate the motor position dependent compensation value for all possible motor positions. It is also possible to use multiple scans in order to get an average result, or to iteratively reach a best result.

The benefit of this method is that the positioner itself is used to determine an optimized motor position dependent compensation value. In this way, the motor position dependent compensation value can be adapted to slow changes in the positioner over time, e.g. due to thermal drifts, without the need of additional test equipment.

In an alternative embodiment, the motor position dependent compensation value of a compensator can be derived by determining the motor position dependent motor constant of a motor and derive the motor position dependent compensation value from this information. The motor position dependent motor constant is determined by determining the relation between an input signal and a corresponding output signal of a motor at different motor positions. The input signal can be a motor input, such as a current or a force signal, but it is also possible to use a positioner and use the reference signal as input. The input signal includes a single excitation frequency. The input signal can also be a frequency sweep or white noise, but the single excitation frequency allows a relative quick measurement and a good signal to noise ratio.

The response of the motor to the input signal is measured by a sensor. The sensor measures a position quantity of the motor or in case the position quantity of the motor can be matched to a position quantity of a first object relative to a second object, the sensor measures the latter. In this way it is possible to derive an input signal and corresponding output signal from the sensor in every motor position, or only in the motor positions of interest. Due to the motor position dependent motor constant, a relation between input signal and output signal can be different for every motor position. For instance, a single measurement leads to a plant transfer function $P(x_i, f_e)$ wherein $x_i$ is the motor position and $f_e$ is the excitation frequency. In fact, one measurement gives the response to one excitation vector. This is repeated for independent excitation vectors so that the complete transfer function can be obtained (at one frequency). The relations of the single measurement can be combined into a general relation between input signal and output signal which is dependent on the motor position and the excitation frequency $P(x, f_e)$. The general relation can be divided into a motor position dependent component and a frequency dependent component, such that for instance $P(x, f_e) = D(f_e) A(x)$, wherein $D(f_e)$ is the frequency dependent component and $A(x)$ is the motor position dependent component. The frequency dependent component $(D(f_e))$ contains for example the frequency dependent response of the mechanics (mass, springs, dampers, etc.). From the motor position dependent component $(A(x))$, the motor position dependent motor constant can be derived.

The benefit of this method is that the motor or the positioner itself is used to determine the motor position dependent compensation value. In this way, the motor position dependent compensation value can be adapted to slow changes in the positioner over time, e.g. due to thermal drifts, without the need of additional test equipment.

In yet another embodiment of the invention, the motor position dependent compensation value of a compensator can be derived without determining the actual motor position dependent motor constant of a motor. Therefore, an input signal is provided to the positioner at different motor positions. Preferably, the input signal is provided at a point between the control system and the motor, but it is also possible to provide the input signal as a reference signal or at any other point in the system. The input signal can be a frequency sweep or white noise, but a single excitation frequency is preferred as it allows a relative quick measurement and a good signal to noise ratio.

The response of the motor to the input signal is measured at the different motor positions by measuring a position quantity of the motor with a sensor. It is also possible to measure the difference between signals provided by the sensor and the reference signal and use that difference as response. Preferably, the response is measured at a point after the motor. The measured response and the corresponding input signal can be used to determine a relation between the input signal and the response, thereby obtaining a plant transfer function that preferably includes the motor and the dynamics attached to the motor.

The measured plant transfer function can be represented mathematically by $S(x,f)$, wherein x is the motor position and f is the frequency. If only a single excitation frequency is used, f is a single frequency. The plant transfer function is dependent on the frequency and the motor position. The compensator, which can be represented by $C(x)$ is only motor position dependent, and is preferably designed such that combined with the plant transfer function results in a motor position independent transfer function. $C(x)$ includes the motor position dependent compensation value. The combination of the plant transfer function and the compensator can mathematically be represented by $S(x,f)C(x)=T(f)$, wherein T is the transfer function of the combined compensator and plant transfer function. $S(x, f)$ is known since it was measured using the input signal and the response. The plant transfer function $S(x, f)$ may be square, but in case of an over-actuated system (e.g. 8 actuator forces in combination with 6 degrees of freedom) the pseudo inverse may be used to obtain $S(x,f)^{-1}$. $T(f)$ is a preferred transfer function and can be chosen to be the average of the plant transfer function, or can be chosen to be a single point of the plant transfer function, for instance to be the plant transfer function at a coordinate origin of the motor position. After choosing the preferred transfer function, the motor position compensation value $C(x)$ can be determined by calculating $C(x)=S(x,f)^{-1}T(f)$ such that combined with the plant transfer function results in the preferred transfer function $T(f)$ which is then motor position independent.

The benefit is that the motor position dependent motor position can be derived without determining explicitly the motor position dependent motor constant, which needs at least some additional calculation. Further, the motor position dependent compensation value can be determined using the positioner and therefore does not need additional test equipment or at least very few additional components.

The above mentioned embodiments can apply to one degree of freedom systems, but it is also possible that a positioner includes multiple motors or a motor with multiple actuators. In that case, the signals in the corresponding block schemes of the earlier described embodiments become vectors. An example of a multi degree of freedom system is an electromagnetic planar motor having four actuators above an array of permanent magnets, which may be in a Halbach configuration. Each actuator includes at least one coil, preferably three coils, which can generate a force parallel to the array of permanent magnets and a force perpendicular to the array of permanent magnets. In total eight forces can be generated with four actuators to position the motor in six degrees of freedom. Note that in this case the system is over actuated.

Figure 5:
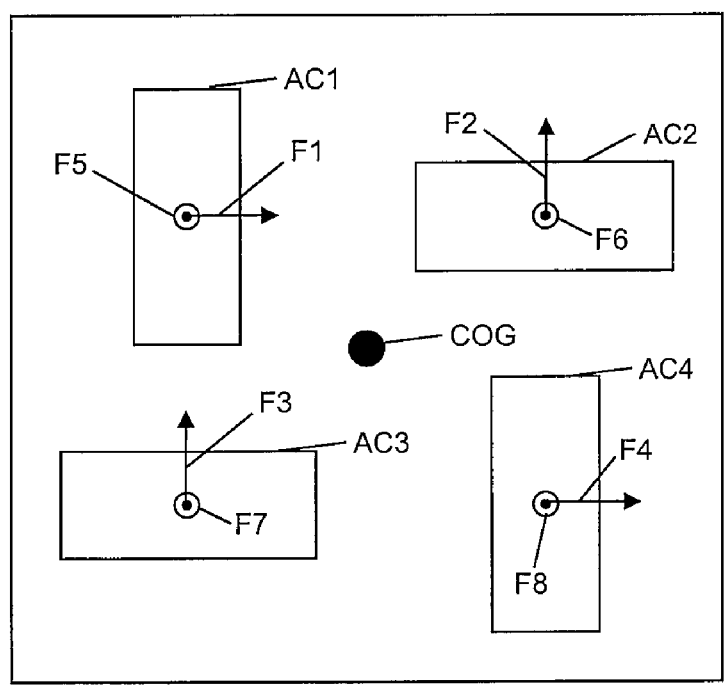
FIG. 5 depicts a schematic representation of a multi degree of freedom motor which can be part of a positioner according to yet another embodiment of the invention.

In FIG. 5, an example of a multi degree of freedom motor as described above is depicted. The system includes four actuators AC1, AC2, AC3, and AC4, wherein each actuator AC1-AC4 includes a coil set C1, C2, C3, and C4. A coil set includes at least one coil, preferably three coils. The coil sets C1-C4 are located above (or below) an array of permanent magnets (not shown) which extends parallel to the plane of the drawing. If properly commutated, a current through the coil sets C1-C4 will generate a force F1, F2, F3, and F4 in either x-direction or y-direction, depending on the orientation of the coil sets C1-C4, as well as a force F5, F6, F7, and F8 perpendicular to the plane of the drawing. The forces F1-F8 can be combined to generate any arbitrary force and torque in a center of gravity COG.

If the system of FIG. 5 would be used for example in a positioner according to the embodiment of FIG. 3B, the motor MOT4 would have eight actuators, each of which requires a drive signal. Drive signal DS4 thus can be an eight element vector. It is also possible that the motor MOT4 includes a current control loop to control the current through the different actuators. Because of the six degree of freedom motor system MOT4, the sensor SENS4 will provide at least a six element vector, each element representing a degree of freedom. The signal generator SG4 is configured to provide six reference signals on the basis of the desired position of the motor or a first object connected to the actuators relative to a second object connected to the array of permanent magnets. In this example, the feed forward system FFS4 and the feedback system FBS4 derive the eight required forces that have to be generated by the motor, which are adapted by the compensator 4 to compensate for the motor position dependent motor constants (note that each actuator has at least a single motor position dependent motor constant for every force it can generate. However, it can also include multiple motor position dependent motor constants in all degrees of freedom). The output of the compensator in this example is an eight element force vector to drive the motor MOT4.

In an alternative embodiment, it is possible that the compensator COMP4 does not use all the available sensor signals, but only uses translational information to determine the required motor position dependent compensation values.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:
1. A lithographic apparatus comprising:
a support constructed to support a patterning device, the patterning device being capable of imparting a radiation beam with a pattern in its cross-section to form a patterned radiation beam;
a substrate table constructed to hold a substrate;
a projection system configured to project the patterned radiation beam onto a target portion of the substrate; and
a positioner configured to position a first part of the apparatus relative to a second part of the apparatus, the positioner comprising
a motor having a motor position dependent motor constant defining a relation between a motor input and a motor output, and
a control system configured to drive the motor, the control system comprising a set-point generator configured to provide a reference signal based on a desired position of the first part relative to the second part, and a controller configured to provide a drive signal to the motor based on the reference signal, wherein the controller comprises a compensator configured to at least partially compensate the drive signal for the motor position dependent motor constant.

2. The lithographic apparatus according to claim 1, wherein the motor is an electromagnetic planar motor, the motor input is a motor current, and the motor output is a motor force.

3. The lithographic apparatus according to claim 1, wherein the controller comprises a feed-forward system, wherein the feed-forward system and the compensator are arranged in series.

4. The lithographic apparatus according to claim 1, wherein the positioner comprises a sensor configured to measure a position quantity of the motor, and the controller comprises a feedback loop system configured to provide a drive signal to the motor based on the difference between the reference signal and a signal provided by the sensor, wherein the compensator is arranged in the feedback loop system.

5. The lithographic apparatus according to claim 1, wherein the compensator is arranged to provide a motor position dependent compensation value in dependency of the reference signal.

6. The lithographic apparatus according to claim 1, wherein the compensator is arranged to provide a motor position dependent compensation value in dependency of signals provided by a sensor.

7. The lithographic apparatus according to claim 1, wherein the first part is the support and the second part is a positioning device configured to position the support.

8. A positioner configured to position a first object relative to a second object, comprising:
   a motor having a motor position dependent motor constant defining a relation between a motor input and a motor output; and
   a control system configured to drive the motor, the control system comprising a set-point generator configured to provide a reference signal based on a desired position of the first object relative to the second object, and a controller to provide a drive signal to the motor based on the reference signal, wherein the controller comprises a compensator configured to at least partially compensate the drive signal for the motor position dependent motor constant.

9. A method to optimize a positioner configured to position a first object relative to a second object, the positioner comprising a motor having a motor position dependent motor constant defining a relation between a motor input and a motor output, and a control system to drive the motor, the control system comprising a set-point generator to provide a reference signal based on a desired position of the first object relative to the second object, and a controller to provide a drive signal to the motor based on the reference signal, wherein the controller comprises a compensator which is configured to at least partially compensate the drive signal for the motor position dependent motor constant with a motor position dependent compensation value, the method comprising:
   a) providing a reference signal and a motor position dependent compensation value to the positioner and measuring a corresponding error signal, the error signal being the difference between the reference signal and a signal provided by a sensor;
   b) deriving a model of the positioner to predict the effect of a change in the motor position dependent compensation value on the error signal;
   c) predicting a change of the motor position dependent compensation value which reduces the error signal using the model, the reference signal, the position dependent compensation value, and the error signal.

10. The method according to claim 9, wherein the compensator is described in terms of parameters to get a linear relation between the change in the position dependent compensation value and the error signal, and wherein in c) the reference signal and the error signal are provided to an inverse of the model to estimate the change to the motor position dependent compensation value which reduces the error signal.

11. The method according to claim 9, wherein a)-c) are repeated after a certain time interval in order to adapt to slow changes in the positioner over time.

12. A method to derive a motor position dependent compensation value of a positioner configured to position a first object relative to a second object, the positioner comprising a motor having a motor position dependent motor constant defining a relation between a motor input and a motor output, and a control system configured to drive the motor, the control system comprising a set-point generator configured to provide a reference signal based on a desired position of the first object relative to the second object, and a controller configured to provide a drive signal to the motor based on the reference signal, wherein the controller comprises a compensator configured to at least partially compensate the drive signal for the motor position dependent motor constant with the motor position dependent compensation value, the method comprising:
   a) providing an input signal to the positioner at different motor positions;
   b) measuring a response of the motor to the input signal by measuring a position quantity of the motor with a sensor at the different motor positions;
   c) determining a relation between the input signal and corresponding response at the different motor positions; and
   d) deriving the motor position dependent compensation value from the determined relation between input signal and corresponding response and a preferred relation between input signal and motor response so that the motor position dependent compensation value will result in the preferred relation.

13. The method according to claim 12, wherein the relation between input signal and corresponding response includes the dynamics of the positioner and the motor.

14. The method according to claim 12, wherein the input signal in a) is at a single excitation frequency.

15. A method to derive a motor position dependent motor constant of a motor, the method comprising:
   a) providing an input signal at different motor positions;
   b) measuring a response of the motor to the input signal by measuring a position quantity of the motor with a sensor at the different motor positions;
   c) determining a relation between the input signal and corresponding response at the different motor positions;
   d) dividing the relation into a motor position dependent component and a frequency dependent component; and
   e) deriving from the motor position dependent component the motor position dependent motor constant.

16. The method according to claim 15, wherein the input signal in a) is at a single excitation frequency.

* * * * *